(12) United States Patent
Lee et al.

(10) Patent No.: US 10,937,840 B2
(45) Date of Patent: Mar. 2, 2021

(54) DISPLAY DEVICE

(71) Applicant: SAMSUNG DISPLAY CO., LTD., Yongin-si (KR)

(72) Inventors: Dae Woo Lee, Hwaseong-si (KR); Il Hun Seo, Asan-si (KR); Ho Jin Yoon, Hwaseong-si (KR); Min Seong Yi, Seoul (KR); Yun Mo Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/371,358

(22) Filed: Apr. 1, 2019

(65) Prior Publication Data

US 2020/0006446 A1    Jan. 2, 2020

(30) Foreign Application Priority Data

Jun. 28, 2018   (KR) ........................ 10-2018-0074767

(51) Int. Cl.
| | | |
|---|---|---|
| *H01L 21/00* | (2006.01) | |
| *H01L 27/32* | (2006.01) | |
| *G09G 3/3225* | (2016.01) | |
| *H01L 51/52* | (2006.01) | |

(52) U.S. Cl.
CPC ....... *H01L 27/3225* (2013.01); *G09G 3/3225* (2013.01); *H01L 27/3276* (2013.01); *H01L 51/524* (2013.01)

(58) Field of Classification Search
CPC .. H01L 27/3225; H01L 51/524; G09G 3/3225
See application file for complete search history.

(56) References Cited

U.S. PATENT DOCUMENTS

| | | | | |
|---|---|---|---|---|
| 6,618,029 B1 * | 9/2003 | Ozawa | ..................... | G09G 3/30 257/40 |
| 6,809,481 B2 * | 10/2004 | Seo | ..................... | G09G 3/3225 315/169.1 |
| 7,462,897 B2 * | 12/2008 | Endo | ..................... | G09G 3/3233 250/553 |
| 7,545,094 B2 * | 6/2009 | Choi | ..................... | H01L 51/524 313/504 |

(Continued)

FOREIGN PATENT DOCUMENTS

| | | | | |
|---|---|---|---|---|
| KR | 10-1160822 | | 6/2012 | |
| KR | 10-2015-0135724 | | 12/2015 | |
| KR | 20200002044 A | * | 1/2020 | ......... H01L 27/3276 |

*Primary Examiner* — Laura M Menz

(74) *Attorney, Agent, or Firm* — F. Chau & Associates, LLC

(57) ABSTRACT

A display device includes a display area and a non-display area at least partially surrounding the display area. A first display substrate includes a plurality of thin film transistors. A second display substrate is disposed opposite to the first display substrate. A seal member is disposed within the non-display area and is disposed between the first display substrate and the second display substrate. The seal member is configured to attach the first display substrate to the second display substrate. Each of the plurality of thin film transistors includes a gate electrode. The gate electrode of at least one of the plurality of thin film transistors overlaps the seal member in a thickness direction of the display device.

16 Claims, 11 Drawing Sheets

(56) References Cited

U.S. PATENT DOCUMENTS

| | | | | |
|---|---|---|---|---|
| 7,795,803 B2* | 9/2010 | Kim | ............... | H01L 51/524 |
| | | | | 313/504 |
| 7,821,197 B2* | 10/2010 | Lee | ............... | H01L 51/56 |
| | | | | 313/504 |
| 8,125,146 B2* | 2/2012 | Park | ............... | H01L 51/5246 |
| | | | | 313/512 |
| 8,164,257 B2* | 4/2012 | Choi | ............... | H01L 27/3276 |
| | | | | 313/512 |
| 8,208,086 B2* | 6/2012 | Choi | ............... | H01L 51/0541 |
| | | | | 349/43 |
| 8,415,880 B2* | 4/2013 | Choi | ............... | H05B 33/04 |
| | | | | 313/512 |
| 8,766,906 B2* | 7/2014 | Yoshida | ............... | G09G 3/2022 |
| | | | | 345/102 |
| 8,796,918 B2* | 8/2014 | Kim | ............... | H01L 51/5246 |
| | | | | 313/506 |
| 8,803,162 B2* | 8/2014 | Lee | ............... | H01L 51/5237 |
| | | | | 257/79 |
| 9,280,027 B2* | 3/2016 | Kim | ............... | G02F 1/136204 |
| 9,793,299 B2* | 10/2017 | Fukuda | ............... | G02F 1/133528 |
| 2006/0170342 A1 | 8/2006 | Kim et al. | | |
| 2016/0116771 A1* | 4/2016 | Shiromoto | ............... | G02F 1/134363 |
| | | | | 257/72 |
| 2017/0102569 A1* | 4/2017 | Kim | ............... | H01L 27/124 |
| 2017/0235168 A1* | 8/2017 | Song | ............... | G02F 1/1337 |
| | | | | 349/123 |
| 2018/0013094 A1* | 1/2018 | Kim | ............... | H01L 51/5253 |
| 2018/0102383 A1* | 4/2018 | Kim | ............... | H01L 27/1259 |
| 2019/0221927 A1* | 7/2019 | Shinada | ............... | G02F 1/13 |
| 2020/0006446 A1* | 1/2020 | Lee | ............... | H01L 27/3276 |
| 2020/0274093 A1* | 8/2020 | Eom | ............... | H01L 51/5246 |
| 2020/0295300 A1* | 9/2020 | Chung | ............... | G06F 1/1637 |

* cited by examiner

DISPLAY DEVICE

This application claims the benefit of and priority to Korean Patent Application No. 10-2018-0074767, filed on Jun. 28, 2018, in the Korean Intellectual Property Office, the disclosure of which is incorporated by reference herein in its entirety.

TECHNICAL FIELD

The present disclosure relates to a display device, and more particularly, to a display device having coupling substrates.

DISCUSSION OF THE RELATED ART

A display device is used for providing visual information such a still image or a moving image to a user. Such display devices may be designed to be in various forms to meet various different needs.

The display device may include a lower substrate and an upper substrate. These two substrates may be fit together securely using a seal member. One commonly used seal member is the frit. The frit may be used to bond the two substrates together using a laser. However, the laser may influence wirings that happen to overlap the seal member. If a driving element is located inside the seal member, extra space may need to be used to space the driving element far enough away from the frit so as not to be damaged by the laser as it seals the frit.

SUMMARY

A display device includes a display area and a non-display area at least partially surrounding the display area. A first display substrate includes a plurality of thin film transistors. A second display substrate is disposed opposite to the first display substrate. A seal member is disposed within the non-display area and is disposed between the first display substrate and the second display substrate. The seal member is configured to attach the first display substrate to the second display substrate. Each of the plurality of thin film transistors includes a gate electrode. The gate electrode of at least one of the plurality of thin film transistors overlaps the seal member in a thickness direction of the display device.

A display device includes a substrate having a display area and a non-display area. A first conductive layer is disposed on the substrate. A first insulating layer is disposed on the first conductive layer. A second conductive layer is disposed on the first insulating layer. A second insulating layer is disposed on the second conductive layer. A third conductive layer is disposed on the second insulating layer. The third conductive layer is located entirely within the non-display area.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
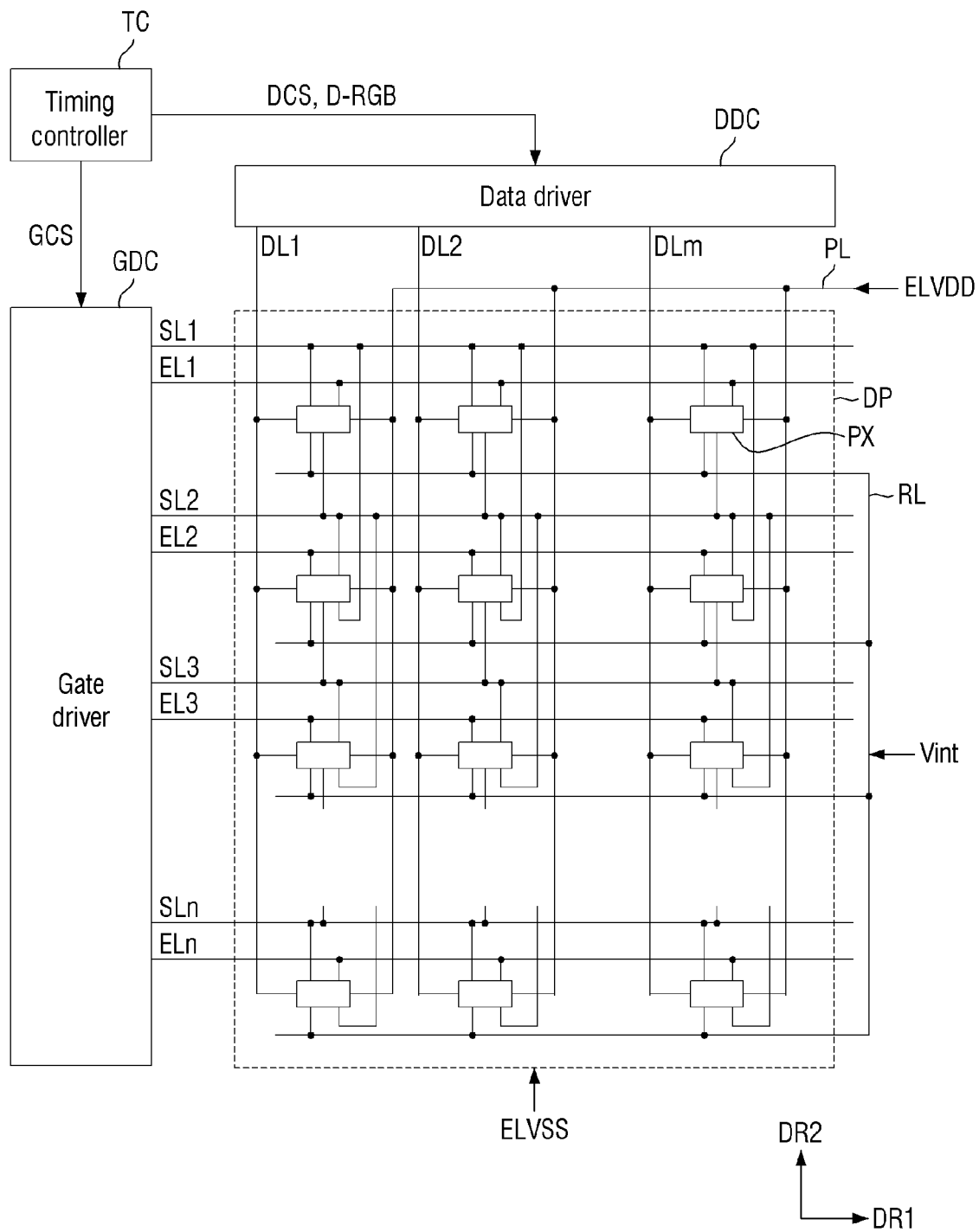
FIG. 1 is a block diagram illustrating an organic light emitting display device according to an exemplary embodiment of the present invention.

Features of the inventive concept and methods of accomplishing the same may be understood more readily by reference to the following detailed description of exemplary embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art.

It will be understood that when an element or layer is referred to as being "on", "connected to" or "coupled to" another element or layer, it can be directly on, connected or coupled to the other element or layer or intervening elements or layers may be present.

Hereinafter, exemplary embodiments will be described with reference to the accompanying drawings. Like reference numerals may refer to like elements throughout the specification and the figures.

A display device, which is a device for displaying a moving image or a still image, may be used as a display screen for various products such as televisions, notebook computers, computer monitors, billboards, and various Internet of Things (IoT) devices as well as in portable electronic appliances such as mobile communication terminals, smart phones, tablet PCs, smart watches, and satellite navigation systems.

The display device may be a light emitting display device, a liquid crystal display device, a field emission display (FED) panel, or an electrophoretic device. In the following exemplary embodiments of the present disclosure, an organic light emitting diode (OLED) display will be described as an example of a display device. However, the present invention is not limited thereto, and it may be assumed that other display devices may be used in place of the OLED display.

Hereinafter, exemplary embodiments of the present invention will be described with reference to the attached drawings.

FIG. 1 is a block diagram illustrating an organic light emitting display device according to an exemplary embodiment of the present invention.

The organic light emitting display device includes a timing controller TC, a gate driver GDC, a data driver DDC, and a display unit DP.

The timing controller TC receives input image signals, converts the data format of the input image signals to conform an interface specification with the gate driver GDC, and generates image data D-RGB. The timing controller TC outputs image data D-RGB and various control signals including DCS and GCS.

The gate driver GDC receives a gate control signal GCS from the timing controller TC. The gate control signal GCS may include a vertical initiation signal for initiating the operation of the gate driver GDC, a clock signal for determining the output timing of signals, and the like. The gate driver GDC generates a plurality of scan signals, and sequentially outputs the plurality of scan signals to a plurality of scan lines SL1 to SLn to be described later. Further, the gate driver GDC generates a plurality of light emission control signals in response to the gate control signal GCS, and outputs the plurality of light emission control signals to a plurality of light emission lines EL1 to ELn to be described later.

A plurality of scan signals and a plurality of light emission control signals may be output from one gate driver GDC, however, the present invention is not limited thereto. According to an exemplary embodiment of the present invention, a plurality of gate drivers GDC may classify and output a plurality of scan signals, and may classify and output a plurality of light emission control signals. Further, in an exemplary embodiment of the present invention, a driving circuit for generating and outputting a plurality of scan signals and a driving circuit for generating and outputting a plurality of light emission control signals may be separately classified.

The data driver DDC receives a data control signal DCS, and image data D-RGB from the timing controller TC. The data driver DDC converts the image data D-RGB into data signals, and outputs the data signals to a plurality of data lines DL1 to DLm to be described later. The data signals are analog voltages corresponding to the gradation values of the image data D-RGB.

The display unit DP includes a plurality of scan lines SL1 to SLn, a plurality of light emission lines EL1 to ELn, a plurality of data lines DL1 to DLm, and a plurality of pixels PX. The plurality of scan lines SL1 to SLn extend in a first direction DR1, and are arranged in a second direction DR2 orthogonal to the first direction DR1. Each of the plurality of light emission lines EL1 to ELn may be arranged in parallel to a corresponding scan line among the plurality of scan lines SL1 to SLn. The plurality of data lines DL1 to DLm intersect the plurality of scan lines SL1 to SLn to be insulated therefrom. Each of the plurality of pixels PX includes a corresponding scan line among the plurality of scan lines SL1 to SLn, a corresponding light emission line among the plurality of light emission lines EL1 to ELn, and a corresponding data line among the plurality of data lines DL1 to DLm.

Each of the plurality of pixels PX receives a first voltage ELVDD and a second voltage ELVSS of a lower level than the first voltage ELVDD. Each of the plurality of pixels PX is connected to a power supply line PL to which the first voltage ELVDD is applied. Each of the plurality of pixels PX is connected to an initialization line RL receiving an initialization voltage Vint.

Each of the plurality of pixels PX may be electrically connected to three scan lines. As shown in FIG. 1, the pixels of a second pixel row may be connected to the first to third scan lines SL1 to SL3.

The plurality of pixels PX may include red pixels emitting red light, green pixels emitting green light, and blue pixels emitting blue light. Each of the plurality of pixels PX includes an organic light emitting diode and a driving circuit of a pixel for controlling the light emission of the organic light emitting diode. The organic light emitting diode of the red pixel, the organic light emitting diode of the green pixel, and the organic light emitting diode of the blue pixel may each include light emitting layers formed of different materials.

The display unit DP may further include a plurality of dummy scan lines. The display unit DP may further include a dummy scan line connected to the pixels PX of the first pixel row and a dummy scan line connected to the pixels PX of the n-th pixel row. Pixels connected to any one of the plurality of data lines DL1 to DLm (hereinafter referred to as pixels of a pixel column) may be connected to each other. Two adjacent pixels among the pixels of the pixel column may be electrically connected to each other.

The timing controller TC, the data driver DDC, and the gate driver GDC may each be mounted on a substrate as a chip, or may be mounted outside of the substrate and connected to the display unit DP.

Although the organic light emitting display device according to an exemplary embodiment of the present disclosure has been described herein with reference to FIG. 1, the display device of the present invention is not limited thereto. Signal lines may be further added or omitted depending on the configuration of the pixel driving circuit. Further, the connection relationship of one pixel and scan lines may be variously changed.

Figure 2:
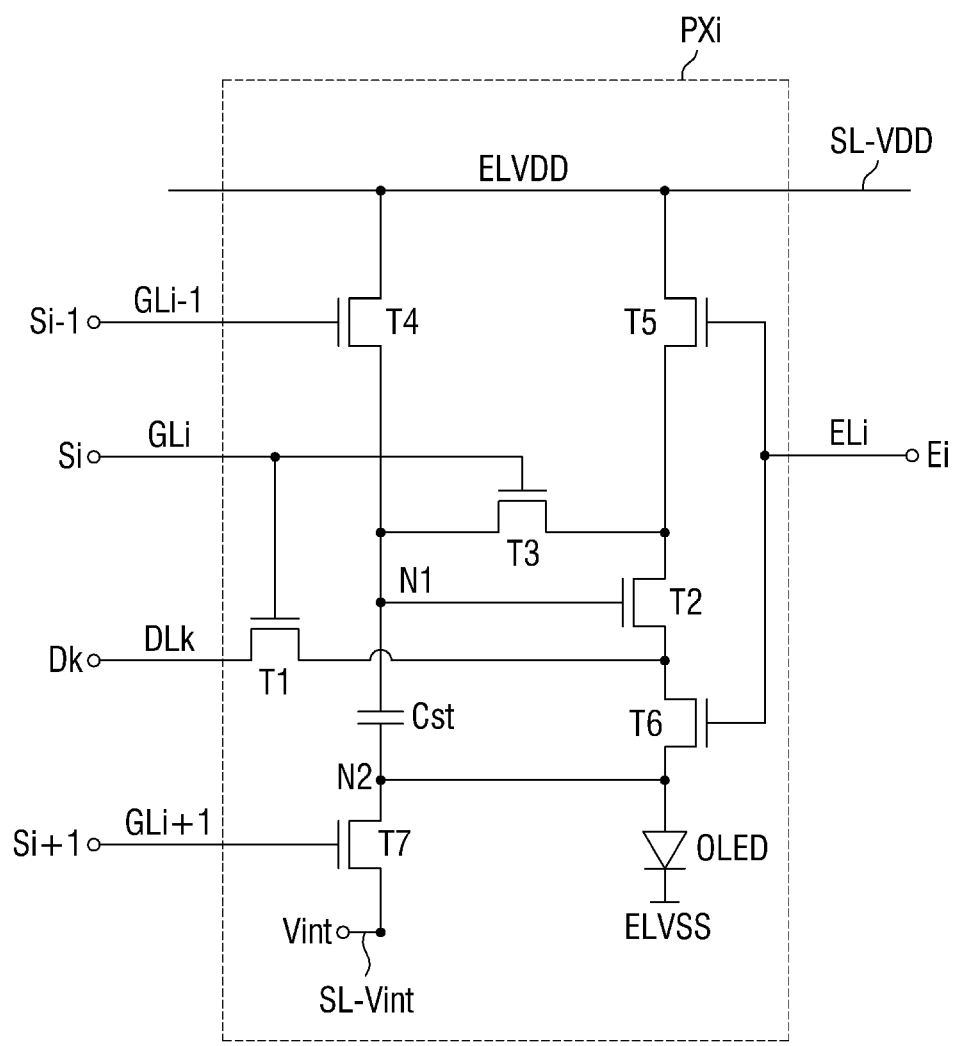
FIG. 2 is an equivalent circuit diagram illustrating a pixel according to an exemplary embodiment of the present invention.

FIG. 2 is an equivalent circuit diagram illustrating a pixel according to an exemplary embodiment of the present invention.

FIG. 2 illustrates an i-th pixel PXi connected to a k-th data line DLk among the plurality of data lines DL1 to DLm. The i-th pixel PXi is activated in response to an i-th scan signal Si applied to an i-th scan line SLi.

The i-th pixel PXi includes an organic light emitting diode OLED and a pixel driving circuit for controlling the organic light emitting diode OLED. The pixel driving circuit may include seven thin film transistors T1 to T7 and one capacitor Cst. Hereinafter, the seven thin film transistors T1 to T7 will be described as N type thin film transistors, however, different types of transistors may alternatively be used. For example, according to an exemplary embodiment of the present invention, the thin film transistors T1 to T7 may also be P type thin film transistors. In the description of FIG. 2, the transistor refers to a thin film transistor.

A driving transistor controls a driving current supplied to the organic light emitting diode OLED. According to an exemplary embodiment of the present invention, the driving transistor may be the first transistor T1. An output electrode of the first transistor T1 is electrically connected to the organic light emitting diode OLED. The output electrode of the first transistor T1 may be in direct contact with an anode of the organic light emitting diode OLED or may be connected to the anode thereof via another transistor.

A control electrode of a control transistor may receive a control signal. The control signal applied to the i-th pixel PXi is an i-th scan signal Si−1, an i-th scan signal Si, an i+1-th scan signal Si+1, and an i-th light emission control signal Ei. According to an exemplary embodiment of the present invention, the control transistor may include second to seventh transistors T2 to T7.

A node between the output terminal of the fourth transistor T4 and the control electrode of the first transistor T1 is defined as a first node N1, and a node between the seventh transistor T7 and the capacitor Cst is defined as a second node N1.

The first transistor T1 includes an input electrode for receiving the first voltage ELVDD via the fifth transistor T5, a control electrode connected to the first node N1, and an output electrode. The output electrode of the first transistor T1 provides the first voltage ELVDD to the organic light emitting diode OLED via the sixth transistor T6. The input electrode of the first transistor T1 is connected to the first node N1 via the third transistor T3. The first transistor T1 controls a driving current supplied to the organic light emitting diode OLED in response to the potential of the first node N1.

The second transistor T2 includes an input electrode connected to the k-th data line DLk, a control electrode connected to the i-th scan line SLi, and an output electrode connected to the output electrode of the first transistor T1. The second transistor T2 is turned on by a scan signal Si (hereinafter referred to as an i-th scan signal) applied to the i-th scan line SLi, and provides a data signal Dk applied to the k-th data line DLk to the capacitor Cst. The second transistor T2 may be referred to as a switching transistor.

The third transistor T3 includes an input electrode connected to the input electrode of the first transistor T1, a control electrode connected to the i-th scan line SLi, and an output electrode connected to the first node N1. The third transistor T3 is turned on in response to the i-th scan signal Si.

When the second transistor T2 and the third transistor T3 are turned on, the first transistor T1 is diode-connected between the second transistor T2 and the third transistor T3. Accordingly, the second transistor T2 is connected to the first node N1 via the first transistor T1, and the third transistor T3.

The capacitor Cst is connected between the first node N1 and the anode of the organic light emitting diode OLED. The capacitor Cst charges a voltage corresponding to the voltage applied to the first node N1.

The fourth transistor T4 includes an input electrode connected to the power supply line PL, a control electrode receiving the i−1-th scan signal Si−1, and an output electrode connected to the first node N1. The fourth transistor T4 is switched in response to the i−1-th scan signal Si−1. The control electrode of the fourth transistor T4 may be connected to the scan line SLi−1. The signal line to which the i−1-th scan signal Si−1 is applied may be changed to a dummy signal line or the like.

The fifth transistor T5 includes an input electrode connected to the power supply line PL, a control electrode connected to the i-th light emission line ELi, and an output electrode connected to the input electrode of the first transistor T1. The fifth transistor T5 is switched in response to the i-th light emission control signal Ei.

The sixth transistor T6 includes an input electrode connected to the output electrode of the first transistor T1, a control electrode connected to the i-th light emission line ELi, and an output electrode connected to the anode of the organic light emitting diode OLED. The sixth transistor T6 is switched in response to the i-th light emission control signal Ei supplied from the i-th light emission line ELi.

A current path is either formed or blocked between the power supply line PL and the organic light emitting diode OLED according to the operation of the fifth transistor T5 and the sixth transistor T6. According to an exemplary embodiment of the present invention, either or both of the fifth transistor T5 and the sixth transistor T6 may be omitted.

The seventh transistor T7 includes an input electrode connected to the initialization line RL, a control electrode receiving the i+1-th scan signal Si+1, and an output electrode connected to the anode of the organic light emitting diode OLED. The control electrode of the seventh transistor T7 may be connected to the i+1-th scan line SLi+1. The signal line to which the i+1-th scan signal Si+1 is applied may be changed to a dummy signal line or the like.

When the fourth transistor T4 is turned on, the first node N1 is reset by the first voltage ELVDD. When the seventh transistor T7 is turned on, the second node N2 is initialized by the initialization voltage Vint. The anode of the organic light emitting diode OLED is initialized by the initialization voltage Vint when the seventh transistor T7 is turned on. The potential difference between the initialization voltage Vint and the second voltage ELVSS applied to the cathode of the organic light emitting diode OLED may be smaller than the light emission threshold voltage of the organic light emitting diode OLED.

Figure 3:
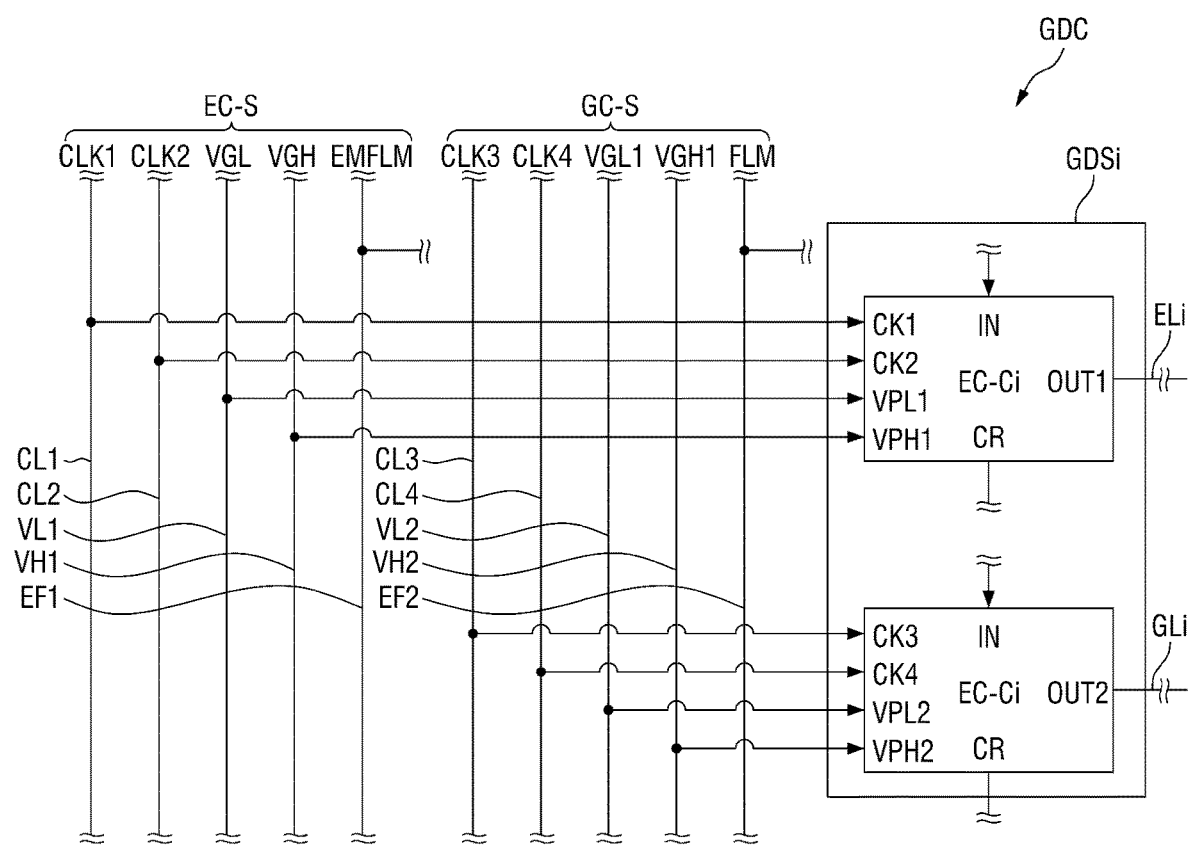
FIG. 3 is a block diagram illustrating a driving stage of a gate driving circuit according to an exemplary embodiment of the present invention.

FIG. 3 is a block diagram illustrating a driving stage of a gate driving circuit according to an exemplary embodiment of the present invention.

FIG. 3 illustrates a driving stage GDSi connected to an i-th gate line GLi and an i-th light emission line ELi among driving stages of the plurality of gate drivers GDC.

The driving stage GDSi may include a light emission control stage EC-Ci and a gate driving stage GC-Ci. Light emission control signals CLK1, CLK2, VGL, VGH, and EMFLM may be provided to the light emission control stage EC-Ci of the driving stage GDSi through a first clock signal line CL1, a second clock signal line CL2, a first voltage line VL1, a second voltage line VH1, and a first initiation signal line EF1. Gate control signals CLK3, CLK4, VGH1, VGL1, and FLM may be provided to the gate driving stage GC-Ci through a third clock signal line CL3, a fourth clock signal line CL4, a third voltage line VL2, a fourth voltage line VH2, and a second initiation signal line EF2.

According to some exemplary embodiments of the present disclosure, the light emission control stage EC-Ci and the gate driving stage GC-Ci are included in one driving stage GDSi, but the present invention is not limited thereto. For example, the light emission control stage EC-Ci and the gate driving stage GC-Ci may be included in different driving stages.

The light emission control stage EC-Ci includes a first clock terminal CK1, a second clock terminal CK2, a first voltage input terminal VPL1, a second voltage input terminal VPH1, an input terminal IN, a carry terminal CR, and an output terminal OUT1.

The first clock terminal CK1 receives a first clock signal CLK1, and the second clock terminal CK2 receives a second clock signal CLK2. The first clock signal CLK1 and the second clock signal CLK2 may be signals having different phases. For example, the second clock signal CLK2 may be a phase-inverted or phase-delayed signal of the first clock signal CLK1.

The first voltage input terminal VPL1 receives a first voltage VGL, and the second voltage input terminal VPH1 receives a second voltage VGH. The voltage level of the first voltage VGL may be lower than the voltage level of the second voltage VGH.

The input terminal IN may receive a carry signal of the previous light emission control stage (for example, EC-Ci−

1), and the carry terminal CR may output a carry signal to the next light emission control stage (for example, EC-Ci+1). The output terminal OUT1 may provide the light emission control signal generated from the light emission control stage EC-Ci to the light emission line ELi.

The initiation signal EMFLM may be input to the input terminal IN of the first light emission control stage (for example, EC-C1) among the light emission control stages.

The gate driving stage GC-Ci includes a third clock terminal CK3, a fourth clock terminal CK4, a third voltage input terminal VPL2, a fourth voltage input terminal VPH2, an input terminal IN, a carry terminal CR, and an output terminal OUT2.

The third clock terminal CK3 receives a third clock signal CLK3, and the fourth clock terminal CK4 receives a fourth clock signal CLK4. The third clock signal CLK3 and the fourth clock signal CLK4 may be signals having different phases. The fourth clock signal CLK4 may be a phase-inverted or phase-delayed signal of the third clock signal CLK3.

The third voltage input terminal VPL2 receives a third voltage VL, and the fourth voltage input terminal VPH2 receives a fourth voltage VGH1. The voltage level of the third voltage VGL1 may be lower than the voltage level of the fourth voltage VGH1.

The input terminal IN may receive a carry signal of the previous gate driving stage (for example, GC-Ci−1), and the carry terminal CR may output a carry signal to the next gate driving stage (for example, GC-Ci+1). The output terminal OUT2 may provide the gate signal generated from the gate driving stage GC-Ci to the gate line GLi.

The initiation signal FLM may be input to the input terminal IN of the first gate driving stage (for example, GC-C1) among the gate driving stages.

Although FIG. 3 illustrates that the input terminal IN of the light emission control stage EC-Ci and the input terminal IN of the gate driving stage GC-Ci are connected to the respective carry terminals of the previous stages, the present invention is not limited thereto. The connection between the driving stages may be variously changed.

Figure 4:
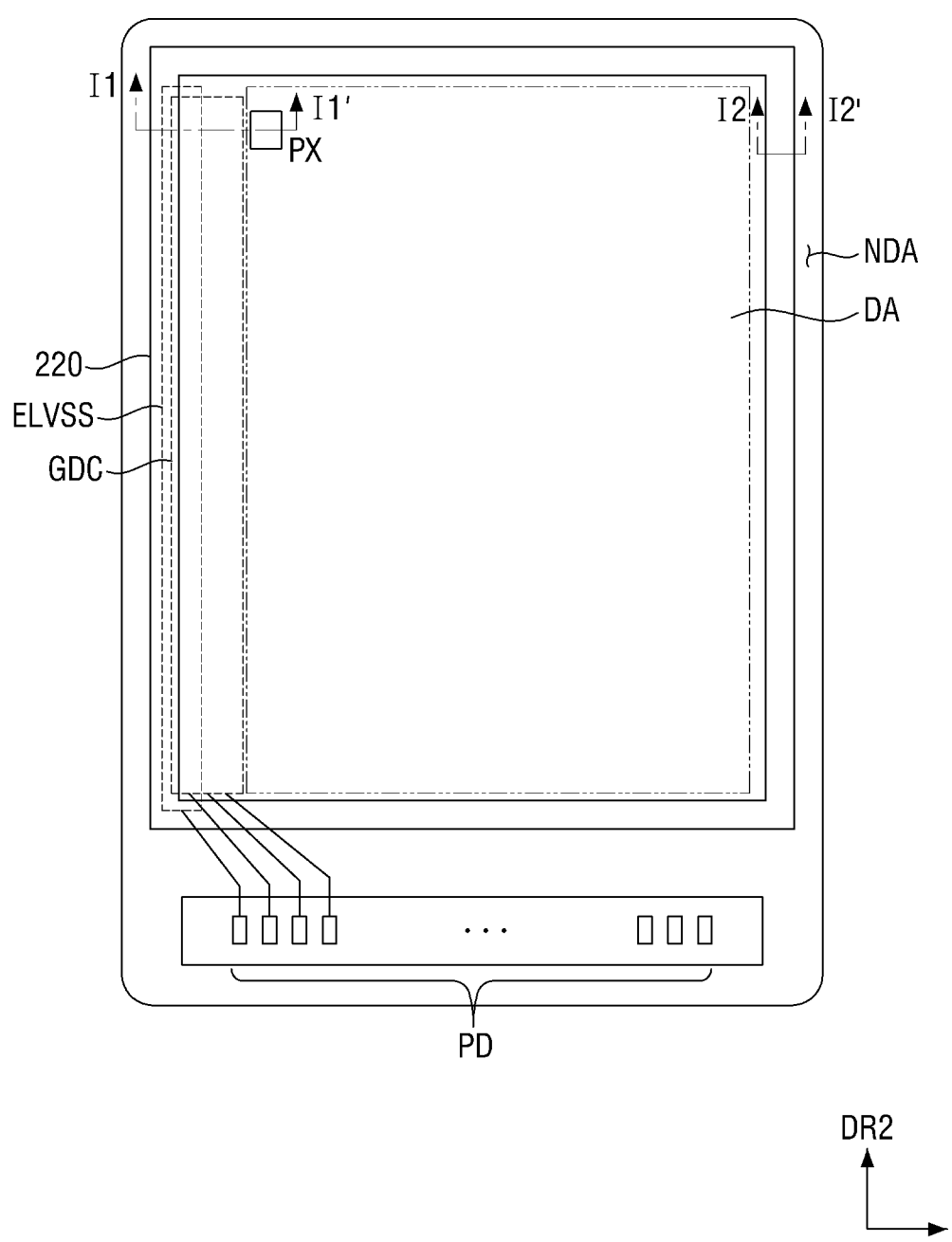
FIG. 4 is a layout view illustrating an organic light emitting display device according to an exemplary embodiment of the present invention.

FIG. 4 is a layout view illustrating an organic light emitting display device according to an exemplary embodiment of the present invention.

As shown in FIG. 4, an organic light emitting diode display 10 includes a display area DA and a non-display area NDA. The non-display area at least partially surrounds the display area DA.

The display unit DP includes a plurality of pixels PX. All of the pixels PX of the display unit DP are located within the display area DA. According to some exemplary embodiments of the present disclosure, the non-display area NDA may be defined along the edge of the display area DA.

The organic light emitting display device 10 includes gate lines GL, data lines DL, light emission lines EL, an initialization voltage line SL-Vint, a first voltage (ELVDD) line, a second voltage (ELVSS) line, and a pad unit PD.

Some of the gate lines GL, the data lines DL, the light emission lines EL, the initialization voltage line SL-Vint, the first voltage (ELVDD) line, and the second voltage (ELVSS) line may be arranged on the same layer, and others thereof may be arranged on different layers.

The non-display area NDA may include a seal member 220 surrounding the display area DA. Details of the seal member 220 will be described later with reference to FIG. 5.

Figure 6:
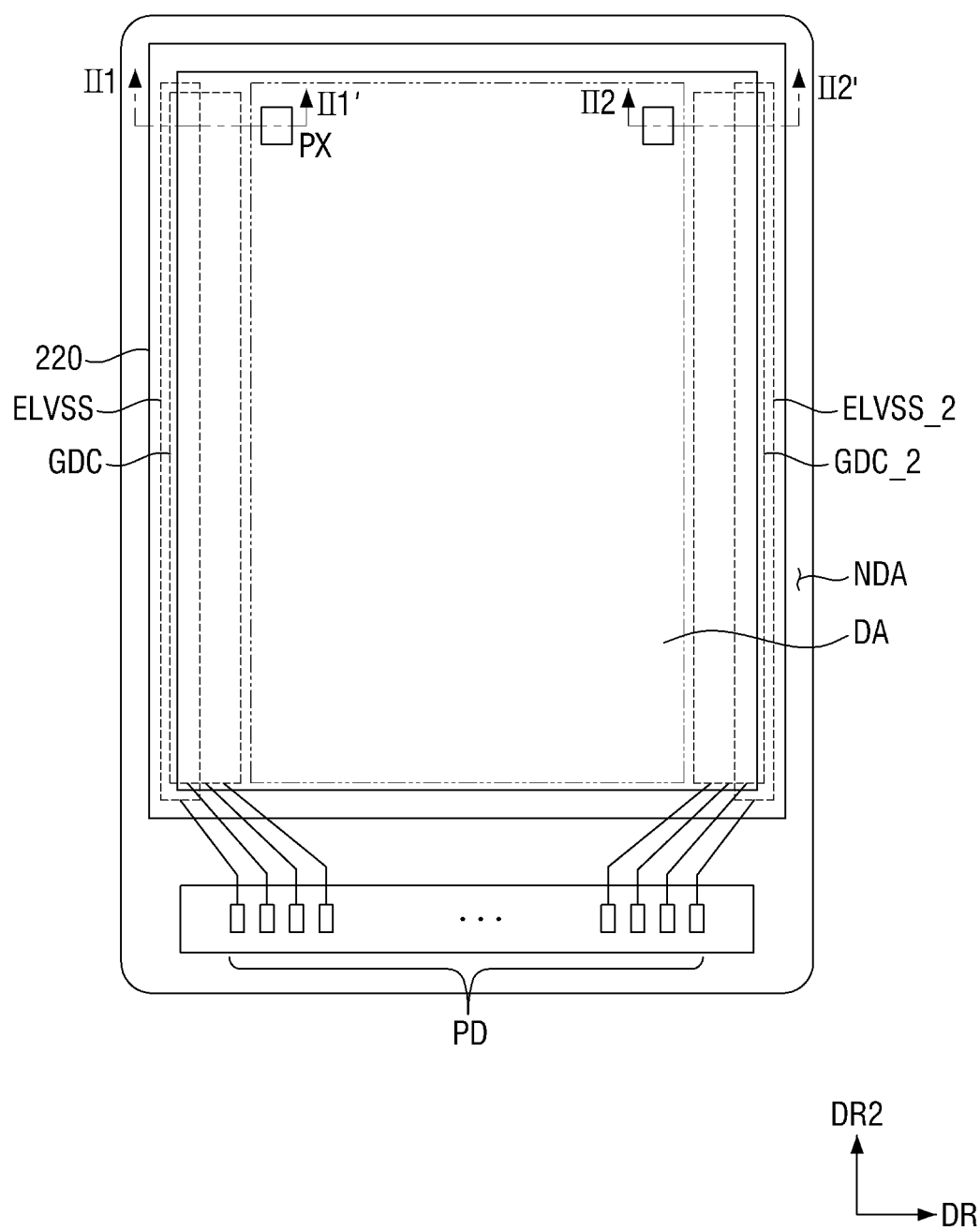
FIG. 6 is a layout view illustrating an organic light emitting display device according to an exemplary embodiment of the present invention.

A gate driver GDC connected to the gate lines GL and the light emission lines EL is disposed at one side of the non-display area NDA. Although it is shown in FIG. 4 that the gate driver GDC is disposed at one side of the organic light emitting diode display 10, the present invention is not limited thereto. For example, as shown in FIG. 6, the gate driver GDC may be disposed at both sides of the non-display area NDA. Details thereof will be described later with reference to FIG. 6.

The gate driver GDC may include a portion overlapping the seal member 220. The distance between the seal member 220 and the pixel PX closest to the seal member 220 may be reduced by disposing the gate driver GDC to overlap the seal member 220.

Each of the gate lines GL is connected to the corresponding pixel PX of the plurality of pixels PX, and each of the data lines DL is connected to the corresponding pixel PX of the plurality of pixels PX. Each of the light emission lines EL may be disposed in parallel to the corresponding one of the gate lines GL. The control signal line may provide control signals to the gate driver GDC. The initialization voltage line may provide an initialization voltage to the plurality of pixels PX. The first and second voltage lines may be connected to the plurality of pixels PX, and may provide a first voltage to the plurality of pixels PX. The first voltage (ELVDD) line may include a plurality of lines extending in the first direction DR1 and a plurality of lines extending in the second direction DR2. The second voltage (ELVSS) line may provide a common voltage to the plurality of pixels PX. The first voltage ELVDD may be a voltage having a lower level than the second voltage ELVSS.

The pad unit PD may be connected to ends of the gate lines GL, the data lines DL, the light emission lines EL, the initialization voltage line SL-Vint, the first voltage (ELVDD) line, and the second voltage (ELVSS).

Figure 5:
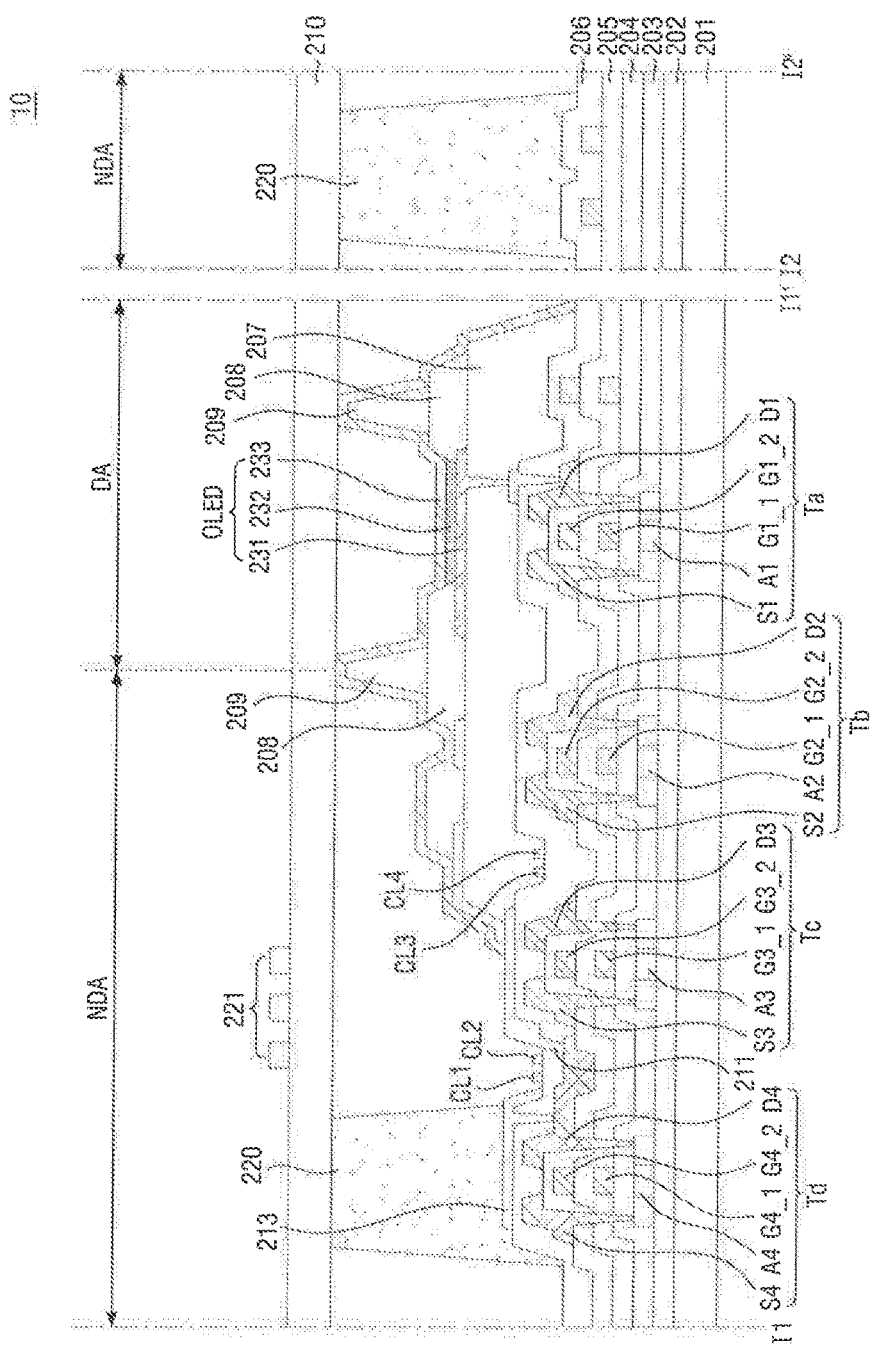
FIG. 5 is a cross-sectional view taken along the lines I1-I1' and I2-I2' of FIG. 4.

FIG. 5 is a cross-sectional view taken along the lines I1-I1' and I2-I2' of FIG. 4.

The organic light emitting display device 10 includes a first substrate 201 and a second substrate 210 facing the first substrate 201.

The first substrate 201 may be a rigid glass substrate or a plastic substrate having heat resistance, for example, a plastic substrate with a melting temperature that is substantially higher than a temperature of the firing of the seal portion. The first substrate 201 may be transparent, opaque, or translucent.

The first substrate 201 may have a display area DA and a non-display area NDA at least partially surrounding the display area DA.

The display area DA may include an area for displaying an image, and may include a display element. For example, the display element may be an organic light emitting diode (OLED).

The non-display area NDA may include a plurality of circuit wirings for transmitting an electric signal to the elements in the display area DA, and may include a seal member 220 for sealing an interior space between the first substrate 201 and the second substrate 210.

A buffer layer 202 is disposed on the first substrate 201. The buffer layer 202 serves to smooth the surface of the first substrate 201 and to prevent the penetration of moisture or external air. The buffer layer 202 may be an inorganic film. The buffer layer 202 may be a single-layer film or a multi layer film.

A first thin film transistor Ta and a storage capacitor Cst may be disposed within the display area DA. In an exemplary embodiment of the present disclosure, the first thin film transistor Ta may be a driving thin film transistor, but the present invention is not limited thereto.

The first thin film transistor Ta includes a semiconductor layer A1, gate electrodes G1_1 and G2_2, a source electrode S1, and a drain electrode D1.

The semiconductor layer A1 is disposed on the butler layer 202. The semiconductor layer A1 may include amorphous silicon, polysilicon, and/or an organic semiconductor. According to an exemplary embodiment of the present disclosure, the semiconductor layer A1 may include an oxide semiconductor. The semiconductor layer A1 may include a channel region, and a source region and a drain region disposed at both sides of the channel region and doped with impurities.

A gate insulating film 203 is disposed on the semiconductor layer A1. The gate insulating film 203 may be an inorganic film. The gate insulating film 203 may be a single-layer film or a multilayer film.

A first gate electrode G 1_1 is disposed on the gate insulating film 203. The first gate electrode G1_1 may be formed of a conductive metal material. For example, the first gate electrode G1_1 may include molybdenum (Mo), aluminum (Al), copper (Cu), and/or titanium (Ti). The first gate electrode G1_1 may be a single-layer film or a multilayer film.

A first interlayer insulating film 204 is disposed on the first gate electrode G1_1. The first interlayer insulating film 204 may be an inorganic film. The first interlayer insulating film 204 may be a single-layer film or a multilayer film.

A second gate electrode G1_2 is disposed on the first interlayer insulating film 204. The second gate electrode G1_2 may be formed of a conductive metal material. For example, the second gate electrode may include molybdenum (Mo), aluminum (Al), copper (Cu), and/or titanium (Ti). The second gate electrode may be a single-layer film or a multilayer film.

The first gate electrode G1_1 and the second gate electrode G1_2 may be formed of the same material. For example, if the first gate electrode G1_1 is formed of aluminum (Al), the second gate electrode G1_2 may also be formed of aluminum (Al).

A second interlayer insulating film 205 is disposed on the second gate electrode G1_2. The second interlayer insulating film 205 may be an inorganic film. The second interlayer insulating film 205 may be a single-layer film or a multilayer film.

A source electrode S1 and a drain electrode D1 are disposed on the second interlayer insulating film 205. A part of the first interlayer insulating film 204, a part of the second interlayer insulating film 205, and a part of the gate insulating film 203 are removed to form a contact hole. The source electrode S1 and the drain electrode D1 may be electrically connected to the source region and the drain region of the semiconductor layer A1 through the contact hole, respectively.

The source electrode S1 and the drain electrode D1 are formed of a conductive metal material. For example, the source electrode S1 and the drain electrode D1 may include molybdenum (Mo), aluminum (Al), copper (Cu), and/or titanium (Ti).

The source electrodes S1 and S2 and the drain electrodes D1 and D2 may be a single-layer film or a multilayer film. For example, the source electrodes S1 and S2 and the drain electrodes D1 and D2 may have a structure in which titanium (Ti)/aluminum (Al)/titanium (Ti) are laminated.

A third interlayer insulating film 206 may be disposed on the source electrode S1 and the drain electrode D1. The third interlayer insulating film 206 may be an inorganic film. The third interlayer insulating film 206 may be a single-layer film or a multilayer film. According to an exemplary embodiment of the present disclosure, the third interlayer insulating film 206 is optional and may be omitted.

A protective film 207 may be disposed on the third interlayer insulating film 206. The protective film 207 may be an organic film or an inorganic film. The protective film 207 may be a passivation film or a planarizing film. The passivation film and/or the planarizing film are optional and may be omitted.

The storage capacitor Cst includes a first capacitor electrode CE1, a second capacitor electrode CE2, and a dielectric layer interposed therebetween. In an exemplary embodiment of the present disclosure, the dielectric layer may correspond to the interlayer insulating film 204. The first capacitor electrode CE1 may be formed of the same material as the first gate electrode G1_1 or the second gate electrode G1_2 on the same layer. The second capacitor electrode CE2 may be formed of the same material as the source electrode S1 and the drain electrode D1 on the same layer. The protective film 207 may cover the second capacitor electrode CE2.

The first thin film transistor Ta may be electrically connected to the organic light emitting diode OLED.

The organic light emitting diode OLED may be disposed on the protective layer 207. The organic light emitting diode OLED includes a first electrode 231, an organic light emitting layer 232, and a second electrode 233.

The first electrode 231 may be a pixel electrode disposed for each pixel. Further, the first electrode 231 may be an anode electrode of an organic light emitting diode.

The first electrode 231 may include a material having a high work function. The first electrode 231 may include indium-tin-oxide (ITO), indium-zinc-oxide (IZO), zinc oxide (ZnO), and/or indium oxide ($In_2O_3$). As used herein, the phrase "a material having a high work function" is to be understood as any material having a work function similar to any of the aforementioned materials. The above-listed conductive materials each have a relatively high work function and are each relatively transparent when applied in the appropriate thickness. When the organic light emitting display device is a front emission type display device, the first electrode 231 may further include a reflective material such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof, in addition to the above-exemplified conductive material. Accordingly, the first electrode may have a single-layer structure made of the above-listed conductive material and reflective material, or may have a multilayer structure in which these are laminated.

A pixel defining film 208 is disposed on the first electrode 231. The pixel defining film 208 includes an opening exposing at least a part of the first electrode 231. The pixel defining film 208 may include an organic material or an inorganic material. According to an exemplary embodiment of the present disclosure, the pixel defining film 208 may include a material such as a photoresist, a polyimide resin, an acrylic resin, a silicon compound, or a polyacrylic resin.

The organic light emitting layer 232 is disposed on the first electrode 231 exposed by the pixel defining layer 208. A red organic light emitting layer is disposed within the red pixel, a green organic light emitting layer is disposed within the green pixel, and a blue organic light emitting layer is disposed within the blue pixel.

The second electrode 233 is disposed on the organic light emitting layer 232. The second electrode 233 may be a common electrode that is disposed over the entire region so as to cover each of the pixels with a single uninterrupted structure. Further, the second electrode 233 may be a cathode electrode of an organic light emitting diode.

The second electrode 233 may include a material having a low work function. The second electrode 233 may include Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). As used herein, the phrase "a material having a low work function" is to be understood as any material having a work function similar to any of the aforementioned materials. The second electrode 233 may further include an auxiliary electrode. The auxiliary electrode may include a film formed by the deposition of the above-listed material, and the film may be coated thereon with a transparent metal oxide, such as indium-tin-oxide (ITO), indium-zinc oxide (IZO), zinc oxide (ZnO), and/or indium-tin-Zinc-Oxide).

When the organic light emitting display device is a front emission type display device, as the second electrode 233, a conductive layer having a low work function is formed into a thin film, and the thin film may be laminated thereon with a transparent conductive film such as an indium-tin-oxide (ITO) layer, an indium-zinc oxide (IZO) layer, a zinc oxide (ZnO) layer, and/or an indium oxide (In2O3) layer.

The first electrode 231, the organic light emitting layer 232, and the second electrode 233 may constitute an organic light emitting diode.

A hole injection layer and/or a hole transport layer may be disposed between the first electrode 231 and the organic light emitting layer 232. An electron transport layer and/or an electron injection layer may be disposed between the organic light emitting layer and the second electrode.

According to an exemplary embodiment of the present disclosure, a plurality of sub-pixel electrodes may be formed on the first substrate 201. For example, red, green, blue, or white colors may be implemented for each sub-pixel electrode.

According to an exemplary embodiment of the present disclosure, a spacer 209 may be additionally disposed around the sub-pixel electrode. The spacer 209 may be provided so as to protect display characteristics from deteriorating due to an external impact.

The second substrate 210 may be coupled to the first substrate 201. The second substrate 210 serves to protect the organic light emitting diode OLED and other elements from moisture and external air. For example, the second substrate 210 may be an encapsulation substrate. According to some exemplary embodiments of the present disclosure, the encapsulation substrate may be a rigid substrate. For example, the encapsulation substrate may be a glass substrate or a plastic substrate having heat resistance.

Various circuit patterns, such as a power supply pattern, an anti-static pattern, and other circuit patterns, may be formed in the non-display area NDA. According to an exemplary embodiment of the present disclosure, a second thin film transistor Tb, a third thin film transistor Tc, and a fourth thin film transistor Td may each be disposed within the non-display area NDA. The second thin film transistor Tb and the third thin film transistor Tc may be thin film transistors for scan signals, and the fourth thin film transistor Td may be a thin film transistor for light emission control signals.

The second thin film transistor Tb and the third thin film transistor Tc include semiconductor layers A2 and A3, respectively, first gate electrodes G2_1 and G3_1, respectively, second gate electrodes G2_2 and G3_2, respectively, and drain electrodes D2 and D3 respectively. The second thin film transistor Tb and the third thin film transistor Tc may each have the same laminate structure as the first thin film transistor Ta, but the present invention is not limited thereto. For example, according to an exemplary embodiment of the present disclosure, the second thin film transistor Tb and the third thin film transistor Tc may be configured such that the second gate electrodes G2_2 and G3_2 are omitted, and the source electrodes S2 and S3 and the drain electrodes D2 and D3 are disposed on the first gate electrodes G2_1 and G3_1.

A circuit wiring 211 may be disposed within the non-display area NDA. The circuit wiring 211 may be disposed on the third interlayer insulating film 206. The circuit wiring 211 may be formed of the same material as the first electrode 231. The circuit wiring 211 may be electrically connected to the second electrode 233.

A seal member 220 may be disposed within the non-display area NDA. The seal member 220 may be disposed between the first substrate 210 and the second substrate 210. The seal member 220 includes a frit glass. The frit glass includes oxide powder and/or glass powder. An organic material may be added to the frit glass including oxide powder to prepare a gel paste, and the gel paste may be fired at a temperature of about 300+ C. to 500° C. When the frit glass is fired, the organic material dissipates into the atmosphere, and the gel paste is cured to a solid frit.

The thickness of the seal member 220 may be within the range of about 370 µm to about 540 µm.

A power supply wiring 213 may be disposed under the seal member 220. The power supply wiring 213 may be a second voltage (ELVSS) supply line.

The power supply wiring 213 may be connected to the circuit wiring 211. The power supply wiring 213 may be disposed on the same layer as the circuit wiring 211. For example, the power supply wiring 213 may be disposed on the third interlayer insulating film 213.

The power supply wiring 213 may be a wiring to which power is applied from an outside source. The power supply wiring 213 may be formed of the same material as the source electrode S4 and the drain electrode D4 to be described later. For example, the power supply wiring 213 may include molybdenum (Mo). However, the present invention is not limited thereto. According to an exemplary embodiment of the present disclosure, the power supply line 213 may include gold (Au), silver (Ag), copper (Cu), nickel (Ni), platinum (Pt), palladium (Pd), and/or chromium (Cr).

The circuit wiring 211 and the power wiring 213 may each be in contact with the drain electrode D4. The circuit wiring 211 and the power wiring 213 may be electrically connected to each other. For example, a part of the third interlayer insulating film 206 may be removed to form a contact hole, and the drain electrode D4 may be connected to the power supply wring 213 and the circuit wiring 211 through the contact hole. However, the present invention is not limited thereto, and according to an exemplary embodiment of the present disclosure, the circuit wiring 211 and the power supply wiring 213 may be directly connected to each other.

The fourth thin film transistor Td includes a semiconductor layer A4, a first gate electrode G4_1, a second gate electrode G4_2, a source electrode S4, and a drain electrode D4. The source electrode S4 and the drain electrode D4 may each include molybdenum (Mo).

According to an exemplary embodiment of the present disclosure, the source electrode S4 and the drain electrode D4 of the fourth thin film transistor Td may each include molybdenum (Mo), and the source electrodes S1, S2 and S3 and the drain electrodes S1, S2 and S3 of the first to third thin film transistors Ta, Tb and Tc may each include aluminum (Al).

According to an exemplary embodiment of the present disclosure, the source electrodes S3 and S4 and the drain electrodes D3 and D4 of the third thin film transistor Tc and the fourth thin film transistor Td may each include molybdenum (Mo) and may each be disposed on the same layer. In this case, the source electrode S2 and the drain electrode D2 of the second thin film transistor Tb may include a material other than molybdenum (Mo), and may be disposed on a different layer from the third thin film transistor Tc and the fourth thin film transistor Td.

The fourth thin film transistor Td may be disposed to overlap the seal member 220 under the power supply wiring 213. According to an exemplary embodiment of the present disclosure, all portions of the fourth thin film transistor Td may overlap the seal member 220. In this case, a part of the third thin film transistor Tc may overlap the seal member 220.

According to an exemplary embodiment of the present disclosure, a part of the fourth thin film transistor Td may overlap the seal member 220. For example, the first gate electrode G4_1, the second gate electrode G4_2, and the source electrode S4 of the fourth thin film transistor Td may overlap the seal member 220.

In the case of a member including molybdenum (Mo), the member might not be damaged even in the firing of the seal portion thereof in the temperature range of 300° C. to 500° C. For example, the critical temperature of a conductive material including molybdenum (Mo) is about 1000° C. to 1200° C., and thus the source electrode S4 and the drain electrode D1, each including molybdenum (Mo), might not be easily damaged in the firing process of the seal portion thereof even if they are disposed under the seal portion to overlap the seal portion.

When the fourth thin film transistor Td is disposed under the seal member 220 to overlap the sealing member 220, a dead space existing in the non-display area DA may be reduced. For example, the dead space may be reduced to 750 µm or less. The dead space refers to a distance from the seal member 220 to the boundary between the non-display area NDA and the display area DA. For example, the dead space may be a distance between the seal member 220 and the first electrode 231 closest to the seal member 220. When the dead space is reduced as described above, the thickness of a bezel of the display device may be reduced.

A plurality of clock signal lines CL1, CL2, CL3 and CL4 may be arranged within the non-display area NDA. The plurality of clock signal lines CL1, CL2, CL3, and CL4 may be formed on the same layer as the circuit wiring 211. The clock signal lines CL1, CL2, CL3 and CL4 may have a three-layer structure of titanium (Ti)/aluminum (Al)/titanium (Ti).

In an exemplary embodiment of the present disclosure, some of the clock signal lines CL1, CL2, CL3, and CL4 may be disposed to overlap the protective film 207, and others thereof may be disposed in the vicinity of the protective film 207. For example, here, the vicinity of the protective film 207 may be a space between the fourth thin film transistor Td and the third thin film transistor Tc. However, the present invention is not limited thereto. According to an exemplary embodiment of the present disclosure, all of the clock signal lines CL1, CL2, CL3, and CL4 may be disposed to overlap the protective film 207.

A metal pattern layer 214 may be disposed so as not to overlap the fourth thin film transistor Td under the seal member 220.

The metal pattern layer 214 may have a pattern of a plurality of irregularities, and may be formed in a substantially rectangular box shape. The contact area between the metal pattern layer 214 and the seal member 220 disposed on the metal pattern layer 214 increases through the plurality of irregularities formed in the metal pattern layer 300, and thus the seal member 220 may be more strongly bonded to the lower substrate 201.

Further, the metal pattern layer 214 may absorb heat of a laser or reflect the laser to transmit heat to the seal member 220. The metal pattern layer 214 may be a single-layer film or multilayer film including gold (Au), silver (Ag), copper (Cu), nickel (Ni), platinum (Pt), palladium (Pd), aluminum (Al), molybdenum (Mo), and/or chromium (Cr).

A plurality of touch electrodes 221 may be formed on the second substrate 210 to serve as a touch screen. A functional film such as a polarizing film, a color filter, or a cover window may be further formed on the second substrate 210.

FIG. 6 is a layout view of an organic light emitting display device according to an exemplary embodiment of the present invention.

Figure 7:
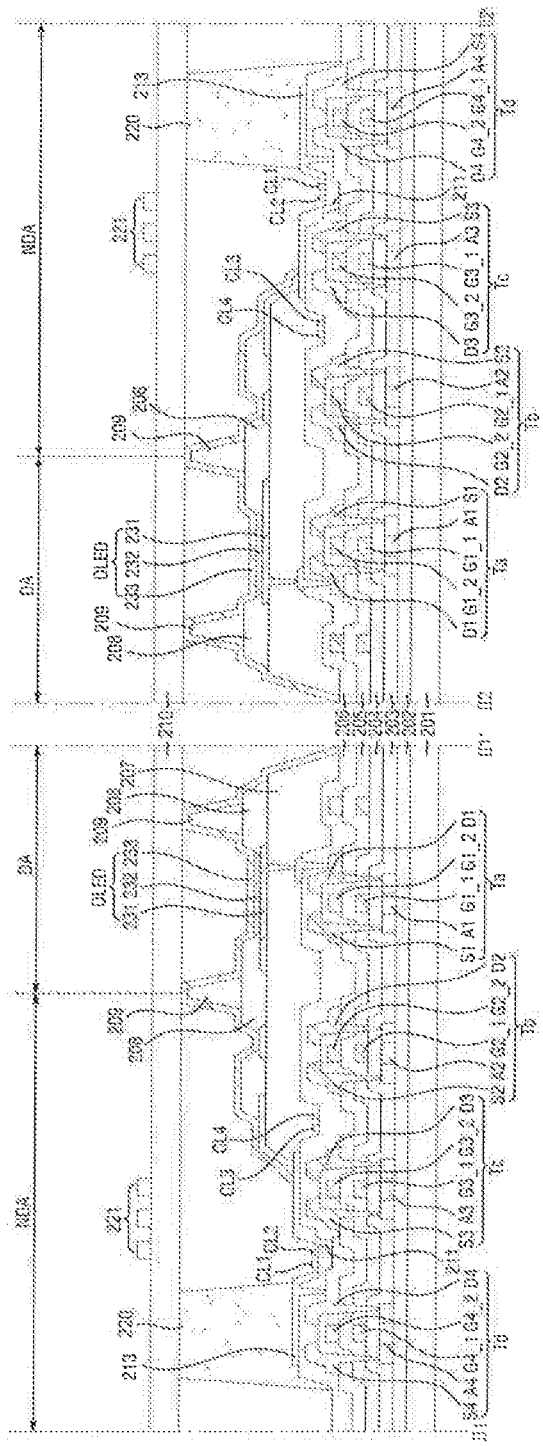
FIG. 7 is a cross-sectional view taken along the lines II1-II1' and II2-II2' of FIG. 6.

FIG. 7 is a cross-sectional view taken along the lines II1-II1' and II2-II2' of FIG. 6.

An organic light emitting display device 11 according to an exemplary embodiment of the present invention is different from the organic light emitting display device 10 according to the embodiment of FIGS. 4 and 5 in that gate drivers GDC and GDC_2 and power supply units ELVSS and ELVSS_2 are disposed at both sides of the non-display area NDA.

Referring to FIGS. 6 and 7, a first gate driver GDC and a first power supply unit ELVSS may be disposed at one side of the non-display area NDA. A second gate driver GDC_2 and a second power supply unit ELVSS_2 may be disposed at a side symmetric to the one side. The first gate driver GDC, the first power supply unit ELVSS, the second gate driver GDC_2, and the second power supply unit ELVSS may each include a portion overlapping the seal member 220.

The organic light emitting display device 11, according to an exemplary embodiment of the present disclosure, may have a symmetrical structure with respect to the center line of the second direction DR2 of the display area DA.

The second gate driver GDC_2 has the same vertical laminate structure as the first gate driver GDC, which is only changed in the left and right directions at the same point. Similarly, the second power supply unit ELVSS_2 has the same vertical laminate structure as the first power supply unit ELVSS, which is only changed in the left and right directions at the same point.

The fourth thin film transistors Td respectively included in the first gate driver GDC and the second gate driver GDC_2 are disposed under the seal member 200 to overlap each other, and thus the organic light emitting display device 11, according to exemplary embodiments of the present invention, may have an effect of reducing the dead space as in the organic light emitting display device 10 of FIGS. 4 and 5.

Figure 8:
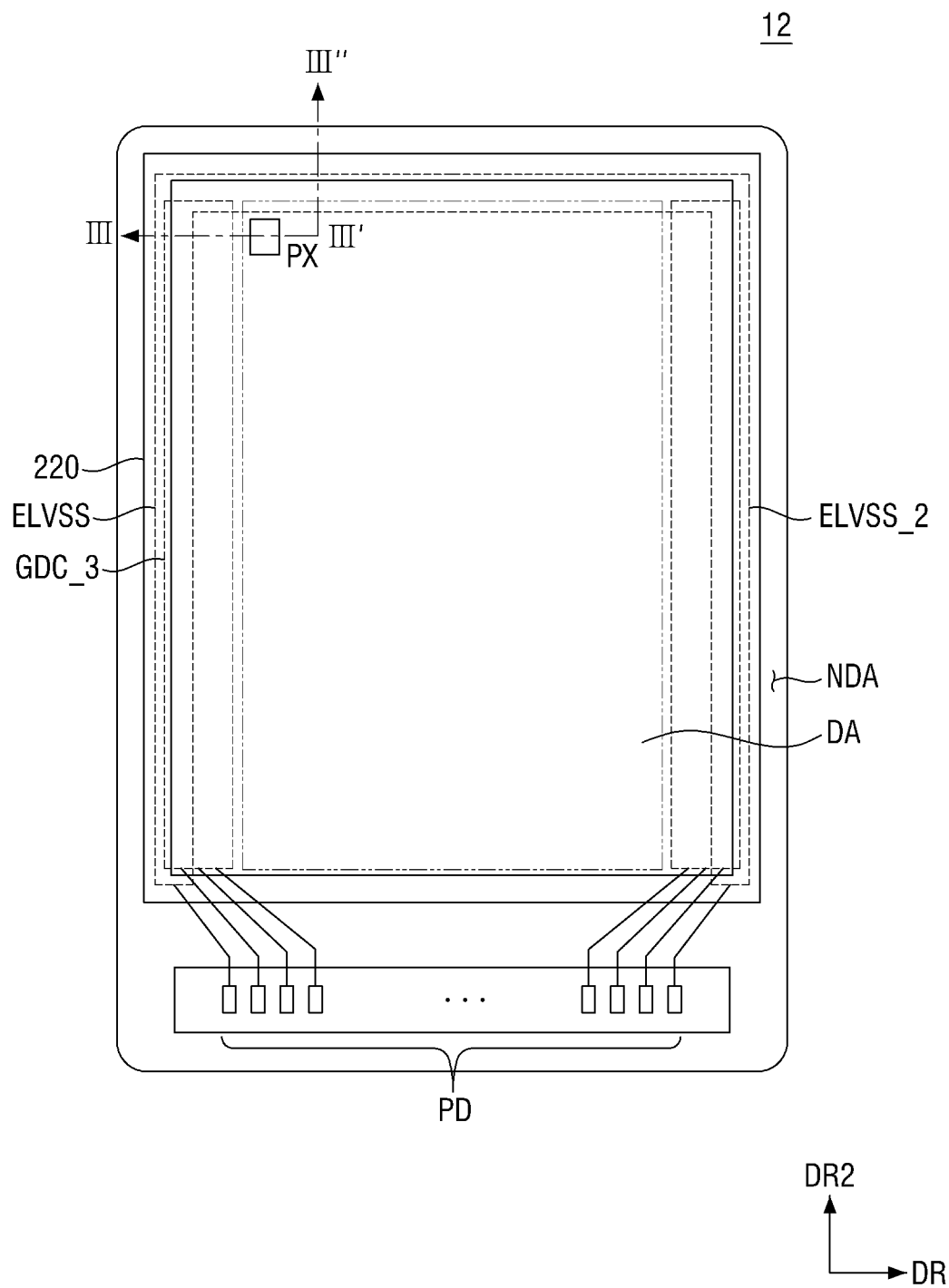
FIG. 8 is a layout view illustrating an organic light emitting display device according to an exemplary embodiment of the present invention.

FIG. 8 is a layout view of an organic light emitting display device according to an exemplary embodiment of the present invention.

Figure 9:
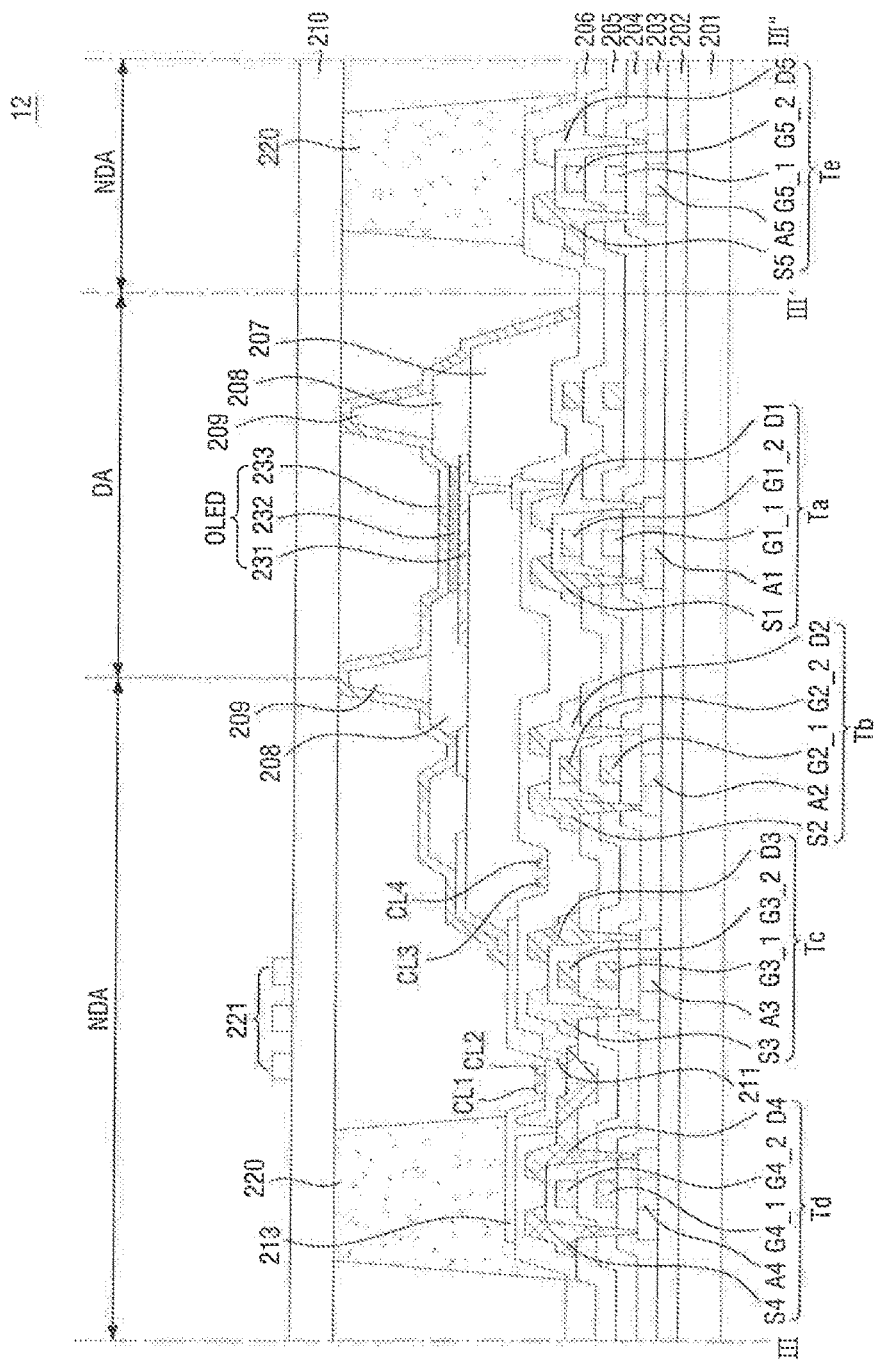
FIG. 9 is a cross-sectional view taken along the line III-III' of FIG. 8.

FIG. 9 is a cross-sectional view taken along the line III-III' of FIG. 8.

An organic light emitting display device 12 according to an exemplary embodiment of the present disclosure is different from the organic light emitting display device 11 according to the embodiment of FIGS. 6 and 7 in that a gate driver GDC_3 surrounding three sides of the display area DA is disposed within the non-display area NDA.

Referring to FIGS. 8 and 9, the gate driver GDC_3 surrounds the display area DA in the non-display area NDA and is disposed integrally. In the gate driver of the organic light emitting display device 12, according to exemplary embodiments of the present disclosure, the arrangement structure and laminate structure of both sides at which the first power supply unit ELVSS and the second power supply unit ELVSS_2 among the three sides may be the same as the arrangement structure and the laminate structure in the organic light emitting display device 11 of FIGS. 6 and 7.

However, the laminate structure of other sides at which the first power supply unit ELVSS and the second power supply unit ELVSS_2 among the three sides might not include the power supply wiring 213 unlike the laminate structure in the organic light emitting display device 11 of FIGS. 6 and 7.

The organic light emitting display device 12 of exemplary embodiments of the present disclosure may further include a fifth thin film transistor Te. In an exemplary embodiment of the present disclosure, the fifth thin film transistor Te may include a dummy electrode.

The fifth thin film transistor Te includes a semiconductor layer A5, gate electrodes G5_1 and G5_2, a source electrode S5, and a drain electrode D5. The laminate film of the fifth thin film transistor Te is the same as the laminate structure of the first thin film transistor Ta, but this need not be the case.

Figure 10:
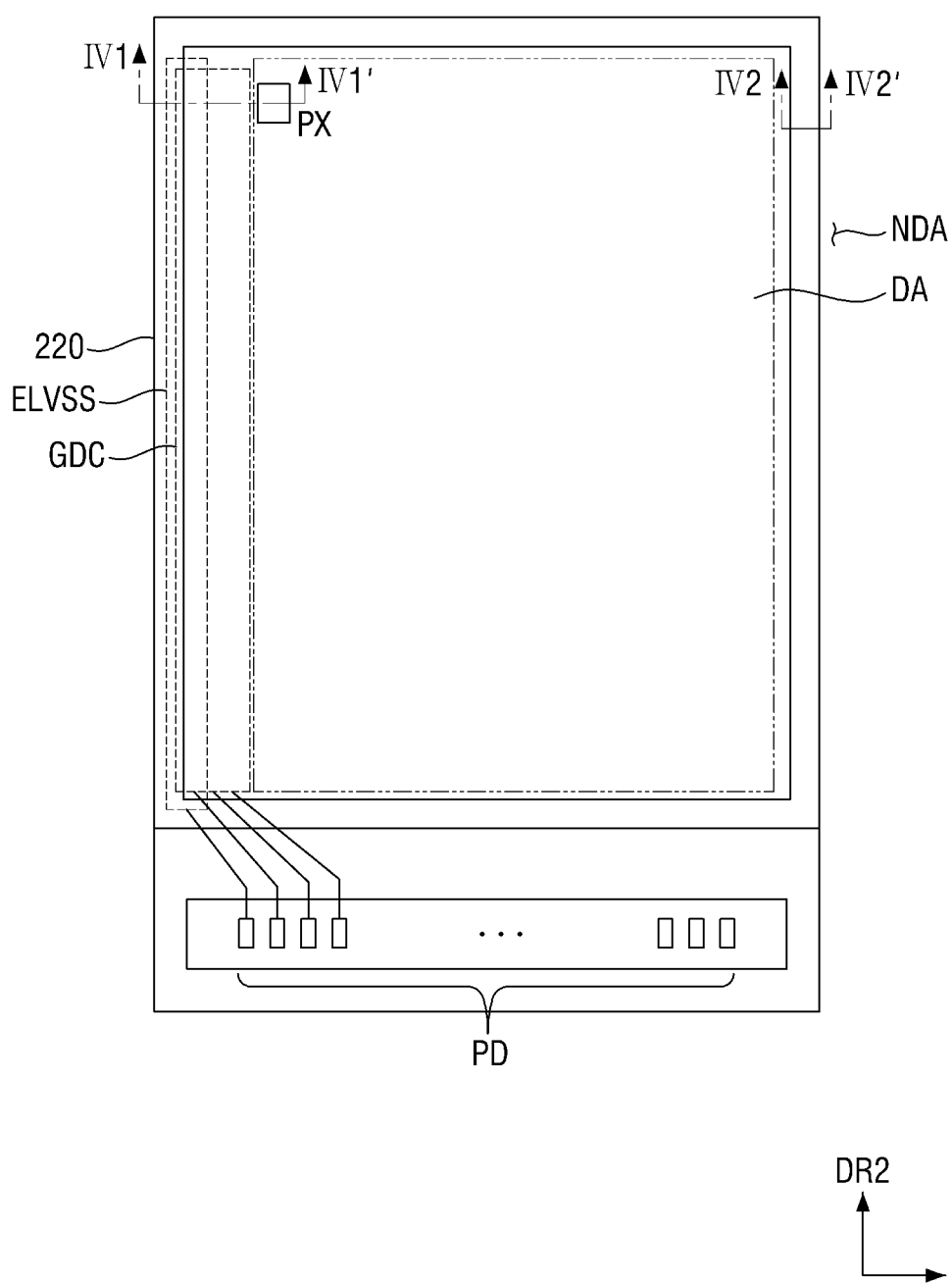
FIG. 10 is a layout view illustrating an organic light emitting display device according to an exemplary embodiment of the present invention.

FIG. 10 is a layout view of an organic light emitting display device according to an exemplary embodiment of the present invention.

Figure 11:
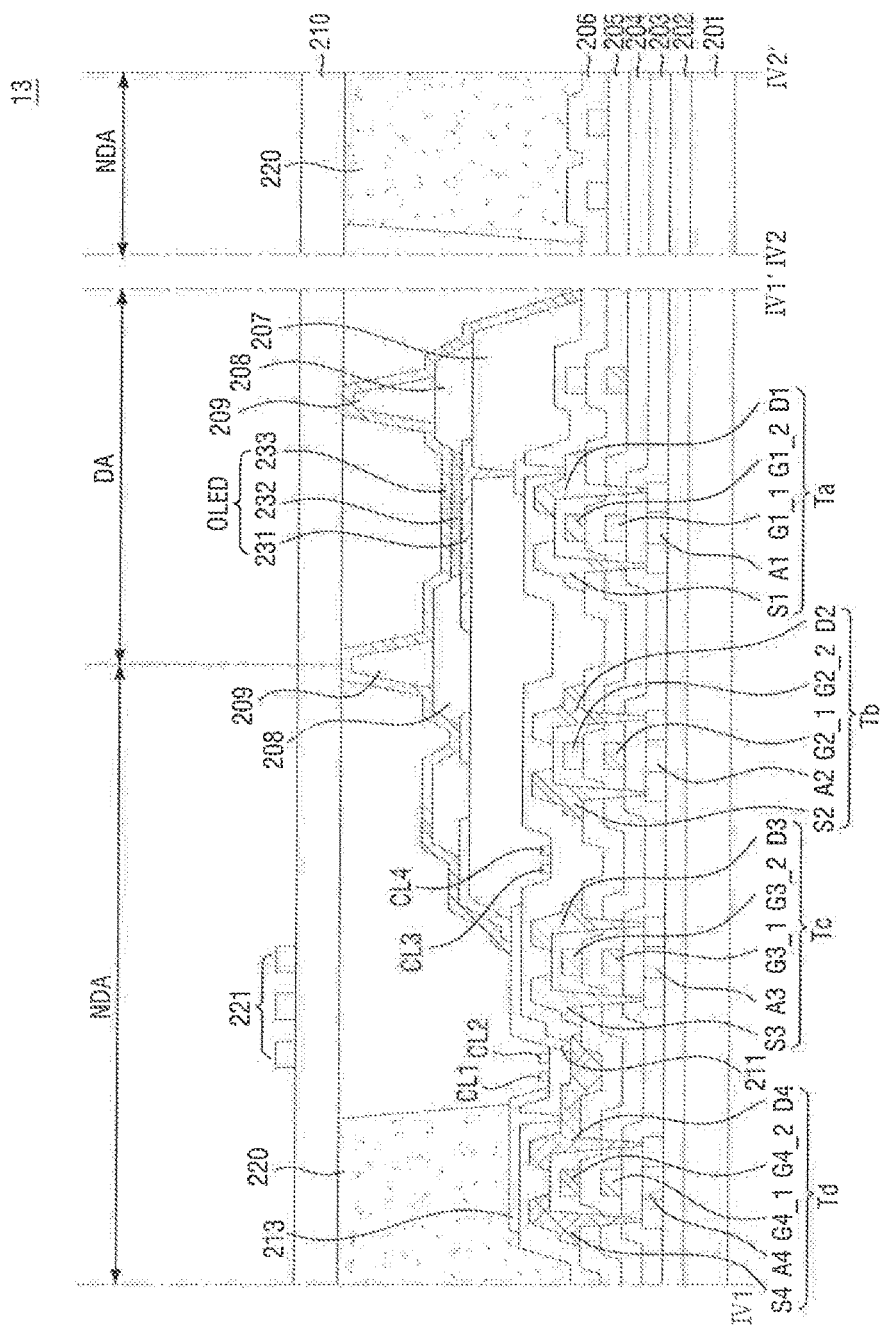
FIG. 11 is a cross-sectional view taken along the lines IV1-IV' and IV2-IV2' of FIG. 10.

FIG. 11 is a cross-sectional view taken along the lines IV1-IV' and IV2-IV2' of FIG. 10.

An organic light emitting display device 13, according to an exemplary embodiment of the present disclosure is different from the organic light emitting display device 10 according to the embodiment of FIGS. 4 and 5 in that the seal member 220 having a rectangular shape can be an edge of the organic light emitting display device 13.

Referring to FIG. 10, a part of the edge of the organic light emitting display device 13 may correspond to three sides of the four sides of the seal member 220 having a rectangular shape.

Referring to FIG. 11, in the organic light emitting display device 13, the seal member 220 forms a cut surface, and may be the same as the laminate structure of the organic light emitting display device 10 of FIG. 5 except that it is aligned with vertically arranged elements.

As described above, according to exemplary embodiments of the present invention, it is possible to realize a display device having a reduced dead space and a thin bezel.

The effects of the present invention are not limited by the foregoing, and other various effects are anticipated herein.

Although some exemplary embodiments of the present invention have been disclosed for illustrative purposes, those skilled in the art will appreciate that various modifications, additions and substitutions are possible, without departing from the scope and spirit of the invention.

What is claimed is:

1. A display device, comprising:
a display area;
a non-display area at least partially surrounding the display area;
a first display substrate including a plurality of thin film transistors;
a second display substrate disposed opposite to the first display substrate and, a seal member disposed within the non-display area and disposed between the first display substrate and the second display substrate, the seal member being configured to attach the first display substrate to the second display substrate,
wherein each of the plurality of thin film transistors includes a gate electrode,
wherein at least one of the plurality of thin film transistors overlaps the seal member in a thickness direction of the display device, and
wherein the gate electrode of the at least one of the plurality of thin film transistors overlaps the seal member in the thickness direction of the display device.

2. The display device of claim 1,
wherein the at least one thin film transistor is a first thin film transistor,
wherein the plurality of thin film transistors further include a second thin film transistor disposed adjacent to the first thin film transistor,
wherein the second thin film transistor is located within the non-display area,
wherein a source electrode and a drain electrode of the first thin film transistor are each formed of a first conductive layer, and wherein a source electrode and a drain electrode of the second thin film transistor are formed of a second conductive layer located on a layer different from the first conductive layer.

3. The display device of claim 2, wherein a gate electrode of the first thin film transistor and a gate electrode of the second thin film transistor are each formed of a third conductive layer located on a layer different from the first conductive layer and the second conductive layer.

4. The display device of claim 3, wherein the plurality of thin film transistors further includes a third thin film transistor disposed within the display area.

5. The display device of claim 4, wherein the gate electrode of the third thin film transistor is formed of the third conductive layer, and the source electrode and the drain electrode of the third thin film transistor are each formed of the second conductive layer.

6. The display device of claim 3, wherein the non-display area includes a gate driver, and wherein the gate driver includes the first thin film transistor and the second thin film transistor.

7. The display device of claim 6, wherein the display device has a rectangular shape, and wherein the gate driver is located at a first side edge of the display device.

8. The display device of claim 2, wherein the first conductive layer includes molybdenum (Mo), and wherein the second conductive layer includes aluminum (Al).

9. The display device of claim 2, further comprising: a power supply wiring connected to the drain electrode of the first thin film transistor, the power supply wiring being formed of the second conductive layer.

10. The display device of claim 2, wherein the gate electrode of the second thin film transistor does not overlap the seal member in the thickness direction of the display device.

11. The display device of claim 2, wherein the display device has a substantially rectangular shape, and wherein the first thin film transistor and the second thin film transistor are each located at a first side edge of the display device.

12. The display device of claim 11, further comprising: a metal pattern layer located at a second side edge of the display device, the second side edge being opposite to the first side edge.

13. The display device of claim 12, wherein the metal pattern layer overlaps a seal member in the thickness direction of the display device.

14. The display device of claim 11,
wherein each of the first thin film transistor and the second thin film transistor includes a plurality of transistors, and
wherein the first thin film transistor and the second thin film transistor are each located at a second side edge of the display device that is opposite to the first side edge.

15. The display device of claim 2, further comprising: a clock wiring disposed between the first thin film transistor and the second thin film transistor.

16. The display device of claim 1, wherein the at least one thin film transistor is a first thin film transistor,
wherein the plurality of thin film transistors further include a second thin film transistor and a third thin film transistor each disposed adjacent to the first thin film transistor and each located in the non-display area,
wherein a source electrode and a drain electrode of each of the first thin film transistor and the second thin film transistor are formed of a first conductive layer, and wherein a source electrode and a drain electrode of the third thin film transistor are formed of a second conductive layer located on a layer different from the first conductive layer.

* * * * *